(12) United States Patent
Tajima

(10) Patent No.: US 8,377,794 B2
(45) Date of Patent: Feb. 19, 2013

(54) METHOD OF MANUFACTURING SEMICONDUCTOR DEVICE, AND SEMICONDUCTOR DEVICE

(75) Inventor: Kazuhisa Tajima, Kumamoto (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 630 days.

(21) Appl. No.: 12/591,932

(22) Filed: Dec. 4, 2009

(65) Prior Publication Data
US 2010/0148299 A1    Jun. 17, 2010

(30) Foreign Application Priority Data
Dec. 15, 2008   (JP) ................................ 2008-318100

(51) Int. Cl.
*H01L 21/762*   (2006.01)
(52) U.S. Cl. ........................................ 438/424; 438/430
(58) Field of Classification Search .................. 438/424, 438/427, 430; 257/510, 520
See application file for complete search history.

(56) References Cited

U.S. PATENT DOCUMENTS 5,094,973 A  *  3/1992  Pang .............................. 438/424
2009/0090992 A1*  4/2009  Lerner et al. .................. 257/506

FOREIGN PATENT DOCUMENTS
JP           4-127148         4/1992

* cited by examiner

*Primary Examiner* — Mark Prenty
(74) *Attorney, Agent, or Firm* — McGinn IP Law Group, PLLC

(57) ABSTRACT

A method of manufacturing a semiconductor device of the present invention include a step of forming, in a substrate, a first trench, and a second trench which crosses the first trench; a step of forming a film over the entire surface of the substrate so as to fill the first trench and the second trench; and a step of removing a portion of the film which resides over the top surface of the substrate, so as to leave the film in the first trench and the second trench; wherein in the step of forming the first trench and the second trench, a projection is formed in a portion of intersection of the first trench and the second trench, so as to extend from one of corners of the portion of intersection towards the center thereof in a plan view.

5 Claims, 4 Drawing Sheets

METHOD OF MANUFACTURING SEMICONDUCTOR DEVICE, AND SEMICONDUCTOR DEVICE

This application is based on Japanese patent application No. 2008-318100, the content of which is incorporated hereinto by reference.

BACKGROUND

1. Technical Field

The present invention relates to a method of manufacturing a semiconductor device, and a semiconductor device thus manufactured.

2. Related Art

As a method of electrically isolating adjacent element-forming regions having different potential (device isolation), there has been known a method of forming trenches having the side wall thereof covered with an insulating layer, and then filling the trenches with a polysilicon film or the like. In the process of filling the trenches with the polysilicon film or the like, the polysilicon film is formed over the entire surface of the substrate so as to fill the trenches, and a portion of the polysilicon film which resides over the top surface of the substrate is then removed typically by dry etching.

In the process of filling the trenches with a film, it is generally necessary to form the film to as thick as equal to or more a half of the width of opening of the trenches. On the other hand, at a portion of intersection where the trenches cross, the width of the trenches is substantially wider than the other portions (approximately 1.4 times, if the trenches cross orthogonally). The film formed over the trenches is, therefore, likely to produce a deep recess at the center of the portion of intersection of the trenches. In a later process of forming an insulating film over the substrate, the recess remained unremoved may not completely be filled with the insulating film, instead leaving a void in the insulating film.

A method of suppressing the above-described void has been disclosed, for example, in Japanese Published patent application A-H04-127148. According to this method, an island pattern, which has an area smaller than the portion of intersection of the trenches, is formed in the portion of intersection when the trenches are formed in the substrate.

The present inventor has recognized as follows. The island pattern described in Japanese Published patent application A-H04-127148 will be shrunk, if the design rule of the semiconductor device further shrinks. In this situation, a resist pattern, which is used for forming the island pattern, will have a larger ratio of height relative to the area of base, making itself unstable, and more likely to fall down. The yield of semiconductor device may consequently degrade.

SUMMARY

In one embodiment, there is provided a method of manufacturing a semiconductor device which includes forming, in a substrate, a first trench, and a second trench which crosses the first trench; forming a film over the entire surface of the substrate so as to fill the first trench and the second trench; and removing a portion of the film which resides over the top surface of the substrate, so as to leave the film in the first trench and the second trench; wherein in the step of forming the first trench and the second trench, a projection is formed in a portion of intersection of the first trench and the second trench, so as to extend from one of corners of the portion of intersection towards the center thereof in a plan view.

According to the method of manufacturing a semiconductor device, a projection is formed in a portion of intersection of the first trench and the second trench, so as to extend from one of corners of the portion of intersection towards the center thereof in a plan view. The substantial width of the trenches at the portion of intersection may, therefore, be narrowed. Accordingly, in the process of filling the first trench and the second trench with the film, the film may be prevented from producing a deep recess at the center of the portion of intersection. In addition, since a resist pattern, which is used for forming the projection, is not isolated, so that the resist pattern is no more unstable, and thereby the yield of semiconductor device is suppressed from being degraded.

In another embodiment, there is provided also a semiconductor device which includes a substrate; a first trench formed in the substrate; a second trench formed in the substrate to cross the first trench; a projection which is formed in a portion of intersection of the first trench and the second trench, so as to extend from one of corners of the portion of intersection towards the center thereof in a plan view; and a film formed so as fill the first trench and the second trench.

According to the present invention, formation of the recess is successfully suppressed from being produced at the center of the portion of intersection of the trenches, and thereby the yield of semiconductor device may be prevented from being degraded.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
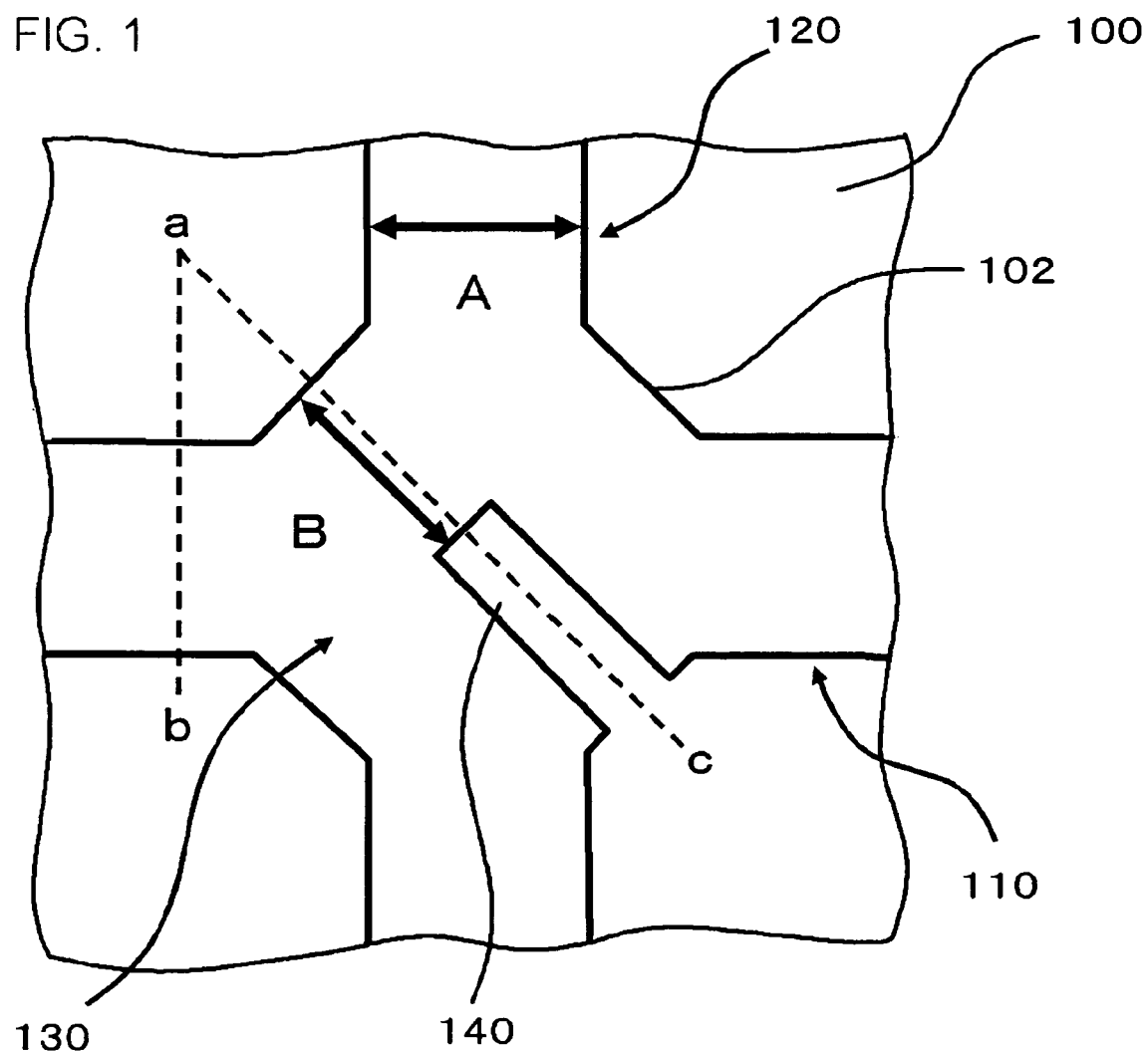
FIG. 1 is a plan view explaining a method of manufacturing a semiconductor device according to one embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiment of the present invention will be explained below, referring to the attached drawings. Note that any similar constituents will be given with similar reference numerals or symbols in all drawings, and explanations therefor will not be repeated.

Figure 2:
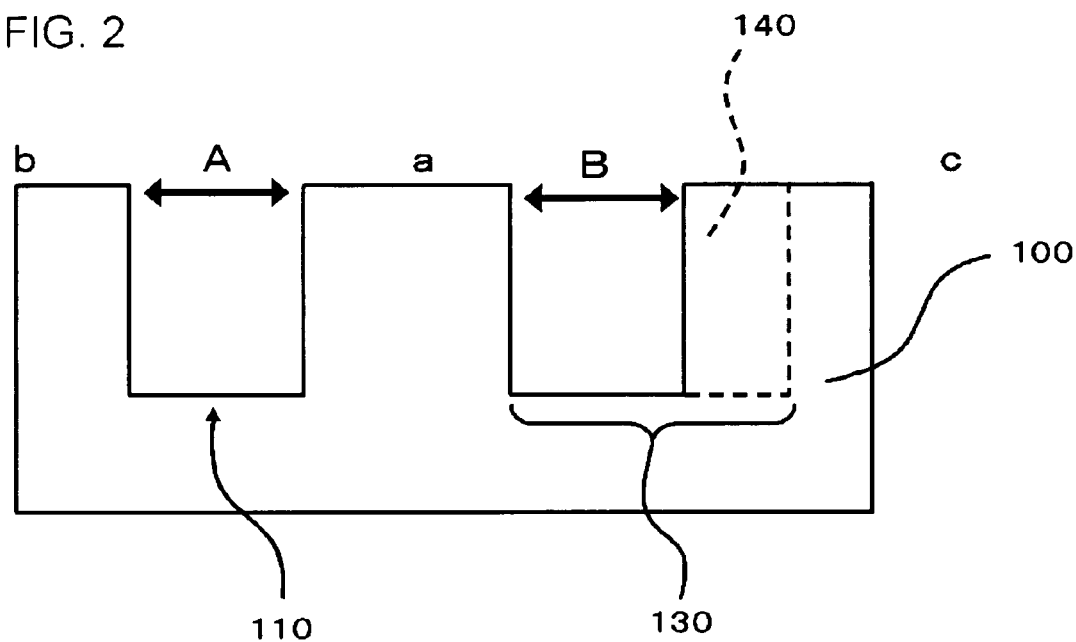
FIGS. 2 to 4 are sectional views explaining the method of manufacturing a semiconductor device according to the embodiment.
Figure 3:
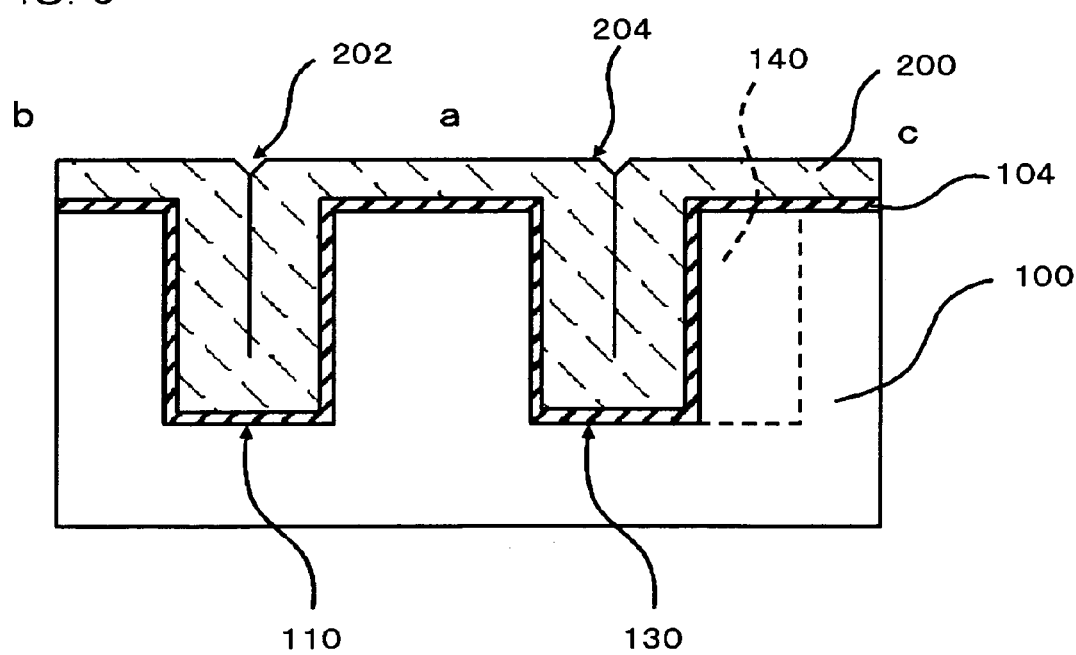
Figure 4:
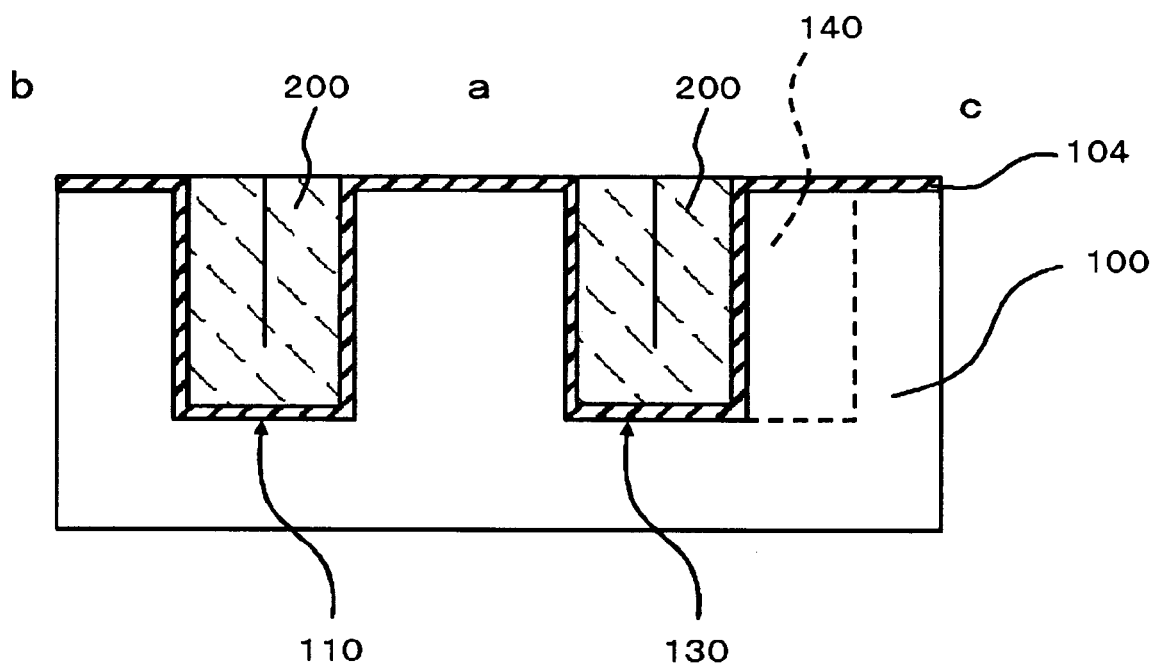
Figure 5:
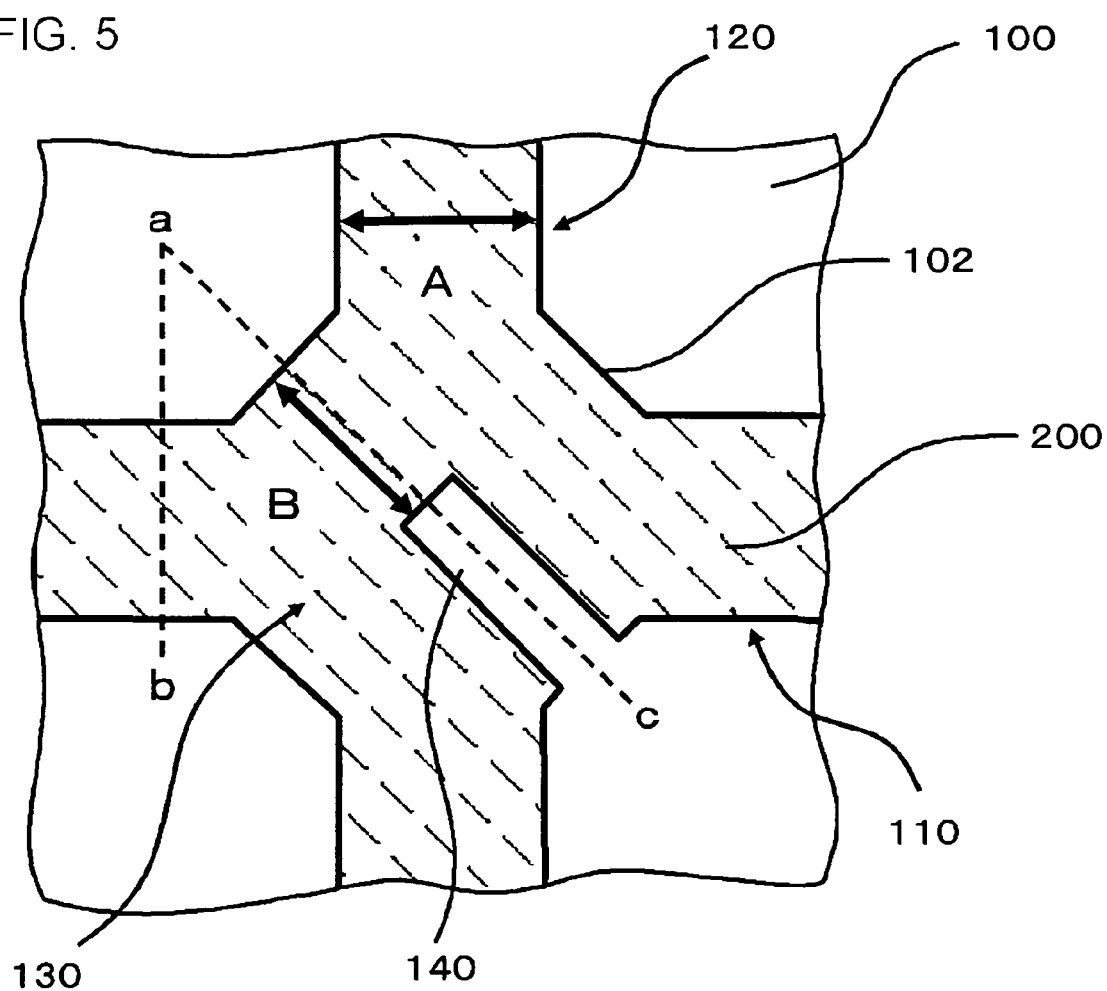
FIG. 5 is a plan view explaining the method of manufacturing a semiconductor device according to the embodiment.

FIG. 1 to FIG. 5 are drawings explaining the method of manufacturing a semiconductor device of one embodiment. FIG. 1 and FIG. 5 are plan views, and FIG. 2, FIG. 3 and FIG. 4 are sectional views taken along line c-a-b in FIG. 1 and FIG. 5. The method of manufacturing a semiconductor device has a step of forming, in a semiconductor substrate 100, a first trench 110 and a second trench 120 which crosses the first trench 110, a step of forming a film 200 over the entire surface of the semiconductor substrate 100 so as to fill the first trench 110 and the second trench 120, and a step of removing a portion of the film 200 which resides over the top surface of the substrate 100, so as to leave the film 200 in the first trench 110 and the second trench 120. In the step of forming the first trench 110 and the second trench 120, a projection 140 is formed in a portion of intersection 130 of the first trench 110 and the second trench 120, so as to extend from one of corners of the portion of intersection 130 towards the center thereof in a plan view. Details will be given below.

First, as illustrated in FIG. 1 and FIG. 2, on the semiconductor substrate 100 typically composed of a silicon substrate, a resist film (not illustrated) is formed, and is then exposed to light and developed. A resist pattern is thus formed over the semiconductor substrate 100. Next, the semiconductor substrate 100, masked by the resist pattern, is etched. As a consequence, the first trench 110, the second trench 120, and the projection 140 are formed in the semiconductor substrate 100.

In this process, a portion of the resist pattern for forming the projection 140 is not isolated, but is formed continuously with the other portion. The resist pattern is, therefore, no more unstable, and thereby the yield of semiconductor device is suppressed from being degraded.

In the example illustrated in the drawings, the first trench 110 and the second trench 120 cross orthogonally in a plan view, and the projection 140 extends 45° away from the direction of extension of the first trench 110. Note that, for the case where the first trench 110 and the second trench 120 do not cross orthogonally, the projection 140 will extend at an angle different from 45° away from the direction of extension of the first trench 110.

The projection 140 is nearly rectangular. Each of four corners 102 of the portion of intersection 130 is chamfered in parallel with any one of the side faces of the projection opposed thereto.

In this embodiment, the distance B from each of three corners 102 of the portion of intersection 130, other than one corner 102 connected to the projection 140, to any one of the opposing side faces of the projection 140, is set equal for all of three corners 102. The first trench 110 and the second trench 120 has the same width A, where distance B from the corner 102 to the projection 140 is not larger than width A of the first trench 110 and the second trench 120, and is preferably equal to width A.

In the process of forming the first trench 110, the second trench 120 and the projection 140 by etching the semiconductor substrate 100, a hard mask typically composed of a silicon nitride film may be adoptable in place of the resist pattern. In this case, the above described resist pattern is used for forming an opening pattern in a hard mask film previously formed over the semiconductor substrate 100.

Next, as illustrated in FIG. 3, an insulating layer 104 is formed over the surface of the semiconductor substrate 100 and the bottom surfaces and on the side faces of the first trench 110, the second trench 120, the three corners 102 and the projection 140. The insulating layer 104 is typically composed of a thermal oxide film, but may be formed by plasma CVD process. For the case where the semiconductor substrate 100 is a silicon substrate, the insulating layer 104 is a silicon oxide film.

Next, a film 200 is formed over the insulating layer 104, typically by plasma CVD. For the case where the semiconductor substrate 100 is a silicon substrate, the film 200 is typically a polysilicon film. Since the projection 140 extends in the portion of intersection 130, so that the width of the opening of the portion of intersection 130 is kept small. Accordingly, a recess 204, which is formed at the center of the portion of intersection 130 in the process filling the first trench 110 and the second trench 120 with the film 200, may be prevented from being deepened. The depth of the recess 204 is nearly equal to the depth of the recess 202 formed at the center of the first trench 110, for example.

Thereafter, as illustrated in FIG. 4 and FIG. 5, a portion of the film formed over the top surface of the semiconductor substrate 100 is removed typically by etch-back process. As described in the above, the recess 204 formed at the center of the portion of intersection 130 may be prevented from being deepened. Accordingly, any deep recess 204 is prevented from remaining after the etch-back process. For the case where the film 200 is a polysilicon film, the film 200 may be used as an interconnect for grounding.

Effects of the present invention will be explained below. As described in the above, the projection 140 extends from one of the corners of the portion of intersection 130 to the center of the portion of intersection 130. Accordingly, the resist pattern for forming the projection 140 is not isolated, but is formed continuously with the other portion of the resist pattern. The resist pattern is, therefore, no more unstable, and thereby the yield of semiconductor device is suppressed from being degraded.

Since the projection 140 extends in the portion of intersection 130, so that the width of the opening of the portion of intersection 130 is kept small. Accordingly, a recess 204, which is formed at the center of the portion of intersection 130 in the process of filling the first trench 110 and the second trench 120 with the film 200, may be prevented from being deepened.

In particular, for the case where the projection 140 has a planar geometry of rectangle, and each of three corners 102 of the portion of intersection 130, other than one corner 102 connected to the projection 140, is chamfered in parallel with any one of the side faces of the projection 140 opposed thereto, the above-described effects may be enhanced, since the portion of intersection 130 may be suppressed from being unsuccessfully filled with the film 200, and may be suppressed from being partially widened in the portion of intersection 130 (for example, distance B may be set smaller than width A of the first trench 110).

The geometry of the projection 140 is not limited to the example shown in this embodiment. The corners of the portion of intersection 130 may not be chamfered. The film 200 may also be a silicon oxide film.

The embodiments of the present invention have been explained referring to the drawings, merely for the purpose of exemplifying the present invention, allowing adoption of various configurations other than those described in the above.

It is apparent that the present invention is not limited to the above embodiments, but may be modified and changed without departing from the scope and spirit of the invention.

What is claimed is:

1. A method of manufacturing a semiconductor device comprising:

forming, in a substrate, a first trench, and a second trench which crosses said first trench;

forming a film over the entire surface of said substrate so as to fill said first trench and said second trench; and removing a portion of said film which resides over the top surface of said substrate, so as to leave said film in said first trench and said second trench;

wherein in said forming said first trench and said second trench, a projection is formed in a portion of intersection of said first trench and said second trench, so as to extend from one of corners of said portion of intersection towards the center thereof in a plan view.

2. The method of manufacturing a semiconductor device as claimed in claim 1, wherein in said forming said first trench and said second trench, said first trench and said second trench are formed to orthogonally cross with each other, and said projection extends 45° away from the direction of extension of said first trench.

3. The method of manufacturing a semiconductor device as claimed in claim 1, wherein in said forming said first trench and said second trench, said projection is made nearly into a rectangle in a plan view, and each of three corners of said portion of intersection, other than one corner connected to said projection, is chamfered in parallel with any one of the side faces of said projection opposed to said each of three corners.

4. The method of manufacturing a semiconductor device as claimed in claim 3, wherein in said forming said first trench and said second trench, said first trench and said second trench are formed to include the same width; and the distance from each of three corners, other than one corner connected to said projection, to any one of the side faces of said projection opposed to said each of three corners, is set equal to the width of said first trench.

5. The method of manufacturing a semiconductor device as claimed in claim 1, wherein said substrate is a silicon substrate, and said film is a polysilicon film, the method further comprising:

forming a silicon oxide film, after said forming said first trench and said second trench, and before said forming said film.

* * * * *